United States Patent
Ting et al.

(10) Patent No.: US 12,166,033 B2
(45) Date of Patent: Dec. 10, 2024

(54) ELECTRONIC DEVICE

(71) Applicant: Innolux Corporation, Miao-Li County (TW)

(72) Inventors: Chin-Lung Ting, Miao-Li County (TW); Jen-Hai Chi, Miao-Li County (TW); Chia-Ping Tseng, Miao-Li County (TW); Chen-Lin Yeh, Miao-Li County (TW); Chung-Kuang Wei, Miao-Li County (TW); Cheng-Hsu Chou, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 443 days.

(21) Appl. No.: 17/513,865

(22) Filed: Oct. 28, 2021

(65) Prior Publication Data

US 2022/0165726 A1 May 26, 2022

Related U.S. Application Data

(60) Provisional application No. 63/118,640, filed on Nov. 26, 2020.

(30) Foreign Application Priority Data

Jan. 28, 2021 (CN) .......................... 202110120067.9

(51) Int. Cl.
*H01L 27/06* (2006.01)
*H01L 29/778* (2006.01)
*H01L 29/93* (2006.01)

(52) U.S. Cl.
CPC ...... *H01L 27/0605* (2013.01); *H01L 29/7786* (2013.01); *H01L 29/93* (2013.01)

(58) Field of Classification Search
CPC . H01L 29/7786; H01L 29/93; H01L 27/0629; H01L 21/8252; H01L 27/0733; H01L 27/0605; H01L 27/0658; H01L 27/0727; H01L 29/66174; H01L 29/778; H01L 29/66431; H01L 29/66462;
(Continued)

(56) References Cited

U.S. PATENT DOCUMENTS 5,705,847 A 1/1998 Kashiwa et al.
10,896,981 B1 * 1/2021 Tao ..................... H01L 21/8252
(Continued)

FOREIGN PATENT DOCUMENTS

JP 2002026253 1/2002
WO 2021011945 1/2021

OTHER PUBLICATIONS

"Search Report of Europe Counterpart Application", issued on Apr. 13, 2022, p. 1-p. 9.

*Primary Examiner* — Mouloucoulaye Inoussa
(74) *Attorney, Agent, or Firm* — JCIPRNET (57) ABSTRACT

The disclosure provides an electronic device. The electronic device includes a substrate, a transistor, and a variable capacitor. The transistor is disposed on the substrate. The variable capacitor is disposed on the substrate and adjacent to the transistor. A material of the transistor and a material of the variable capacitor both a include a III-V semiconductor material. The electronic device of an embodiment of the disclosure may simplify manufacturing process, reduce costs, or reduce dimensions.

9 Claims, 4 Drawing Sheets

(58) Field of Classification Search
CPC .............. H01L 29/2003; H01L 29/861; H01L
29/0646; H01L 27/0883; H01L 29/1066;
H01L 29/205; H01L 29/41758; H01L
21/8258; H01L 21/8249; H01L 27/092;
H01L 29/7371; H01L 27/0623; H01L
27/0635; H01L 29/41708; H01L
29/66318; H01L 29/401; H01L 29/7378;
H01L 29/42304; H01L 29/66212; H01L
29/7783; H01L 2224/49111; H01L
2224/48137; H01L 2224/48227; H01L
2224/0603; H03K 17/687
USPC ... 257/76, 194, 195, 471, E27.012, E27.068,
257/77, E27.016, E27.026, E29.254,
257/E29.338, E29.27, E21.697, E21.605,
257/E29.055, E29.073, E29.317, 532,
257/E29.104, 379, 531, E29.11; 438/172,
438/957, 931, 105
See application file for complete search history.

(56) References Cited

U.S. PATENT DOCUMENTS

| | | | |
|---|---|---|---|
| 2003/0006415 A1* | 1/2003 | Yokogawa | H01L 29/812 257/532 |
| 2011/0298551 A1 | 12/2011 | Yen et al. | |
| 2013/0009165 A1* | 1/2013 | Park | H01L 27/0629 257/E21.403 |
| 2013/0178021 A1* | 7/2013 | Cheng | H01L 27/0629 438/155 |
| 2014/0049296 A1* | 2/2014 | Jeon | H03K 17/6871 327/109 |
| 2014/0117411 A1* | 5/2014 | Kanaya | H01L 29/2003 257/195 |
| 2014/0266494 A1 | 9/2014 | Lan et al. | |
| 2015/0263001 A1* | 9/2015 | Saito | H01L 27/0733 257/296 |
| 2015/0293159 A1 | 10/2015 | van Bezooijen | |
| 2016/0013179 A1* | 1/2016 | Miura | H01L 27/0629 257/401 |
| 2016/0086938 A1* | 3/2016 | Kinzer | H01L 29/7786 257/76 |
| 2016/0372555 A1* | 12/2016 | Twynam | H01L 27/095 |
| 2017/0005086 A1* | 1/2017 | Twynam | H01L 28/40 |
| 2017/0025406 A1* | 1/2017 | Liao | H01L 27/0605 |
| 2018/0233604 A1* | 8/2018 | Gu | H01L 29/20 |
| 2019/0371672 A1* | 12/2019 | Nakano | H01L 29/7786 |
| 2019/0393374 A1* | 12/2019 | Rämer | H01Q 9/28 |
| 2020/0006322 A1* | 1/2020 | Then | H01L 27/0255 |
| 2020/0098745 A1* | 3/2020 | Roig-Guitart | H01L 29/861 |
| 2020/0335526 A1* | 10/2020 | Nidhi | H01L 27/092 |
| 2020/0350427 A1* | 11/2020 | Jiang | H01L 27/0629 |
| 2021/0217883 A1* | 7/2021 | Jones | H01L 27/0733 |
| 2022/0399329 A1* | 12/2022 | Morita | H01L 29/78 |

* cited by examiner

ELECTRONIC DEVICE

CROSS-REFERENCE TO RELATED APPLICATION

This application claims the priority benefit of U.S. provisional application Ser. No. 63/118,640, filed on Nov. 26, 2020, and China application serial no. 202110120067.9, filed on Jan. 28, 2021. The entirety of each of the above-mentioned patent applications is hereby incorporated by reference herein and made a part of this specification.

BACKGROUND

Field of the Disclosure

The disclosure relates to an electronic device, and more particularly, to an electronic device that may simplify manufacturing process, reduce costs, or reduce dimensions.

Description of Related Art

Electronic devices or tiling electronic devices have been widely used in mobile phones, televisions, monitors, tablet computers, car displays, wearable devices, and desktop computers. With the vigorous development of electronic devices, the quality requirements for electronic devices is higher.

SUMMARY OF THE DISCLOSURE

The disclosure provides an electronic device having the effects of simplifying manufacturing process, reducing costs, or reducing dimensions.

According to an embodiment of the disclosure, an electronic device includes a substrate, a transistor, and a variable capacitor. The transistor is disposed on the substrate. The variable capacitor is disposed on the substrate and adjacent to the transistor. A material of the transistor and a material of the variable capacitor both include a III-V semiconductor material.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The disclosure may be understood by referring to the following detailed description in conjunction with the accompanying drawings. It should be noted that in order to facilitate understanding to the reader and to simplify the drawings, the multiple drawings in the disclosure depict a part of the electronic device, and certain elements in the drawings are not drawn to actual scale. In addition, the number and size of each element in the figures are for illustration, and are not intended to limit the scope of the disclosure.

In the following description and claims, the words "including" and "containing" and the like are open words, so they should be interpreted as meaning "including but not limited to . . . "

It should be understood that when an element or film layer is referred to as "on" or "connected to" to another element or film layer, the element or film layer may be directly on the other element or film layer or directly connected to the other element or layer, or there is an inserted element or film layer between the two (indirect case). Conversely, when an element is referred to as "directly" on or "directly connected" to another element or film layer, there is no intervening element or film layer between the two.

Although the terms first, second, third . . . may be used to describe various constituent elements, the constituent elements are not limited to these terms. These terms are used to distinguish a single constituent element from other constituent elements in the specification. The same terms may not be used in the claims, and the elements in the claims may be replaced with first, second, third . . . according to the order stated by the elements in the claims. Therefore, in the following description, the first constituent element may be the second constituent element in the claims.

In some embodiments of the disclosure, terms such as "connection", "interconnection", etc. regarding bonding and connection, unless specifically defined, may mean that two structures are in direct contact, or that two structures are not in direct contact and there are other structures located between these two structures. Moreover, the terms bonding and connecting may also include a case where both structures are movable or both structures are fixed. In addition, the term "coupled" includes any direct and indirect electrical connection means.

An electronic device of the disclosure may include a display device, an antenna device, a sensing device, a light-emitting device, a touch device, or a tiling device, but is not limited thereto. The electronic device may include a bendable or flexible electronic device. The appearance of the electronic device may be rectangular, circular, polygonal, a shape with a curved edge, or other suitable shapes. The display device may, for example, include a light-emitting diode (LED), liquid crystal, fluorescence, phosphor, quantum dot (QD), other suitable materials, or a combination of the above, but is not limited thereto. The LED may include, for example, an organic LED (OLED), inorganic light-emitting diode, mini LED, micro LED, or quantum dot (QD) LED (QLED, QDLED), other suitable materials, or any combination of the above, but is not limited thereto. The display device may also include, for example, a tiling display device, but is not limited thereto. The antenna device may be, for example, an antenna, but is not limited thereto. The antenna device may include, for example, an antenna tiling device, but is not limited thereto. It should be noted that the electronic device may be any combination of the above, but is not limited thereto. In addition, the appearance of the electronic device may be rectangular, circular, polygonal, a shape with a curved edge, or other suitable shapes. The electronic device may have a peripheral system such as a driving system, a control system, a light source system, a shelf system, etc., to support a display device, an antenna device, or a tiling device. Hereinafter, an electronic device is used to illustrate the content of the disclosure, but the disclosure is not limited thereto.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with each other, they may be mixed and used arbitrarily.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

Figure 1A:
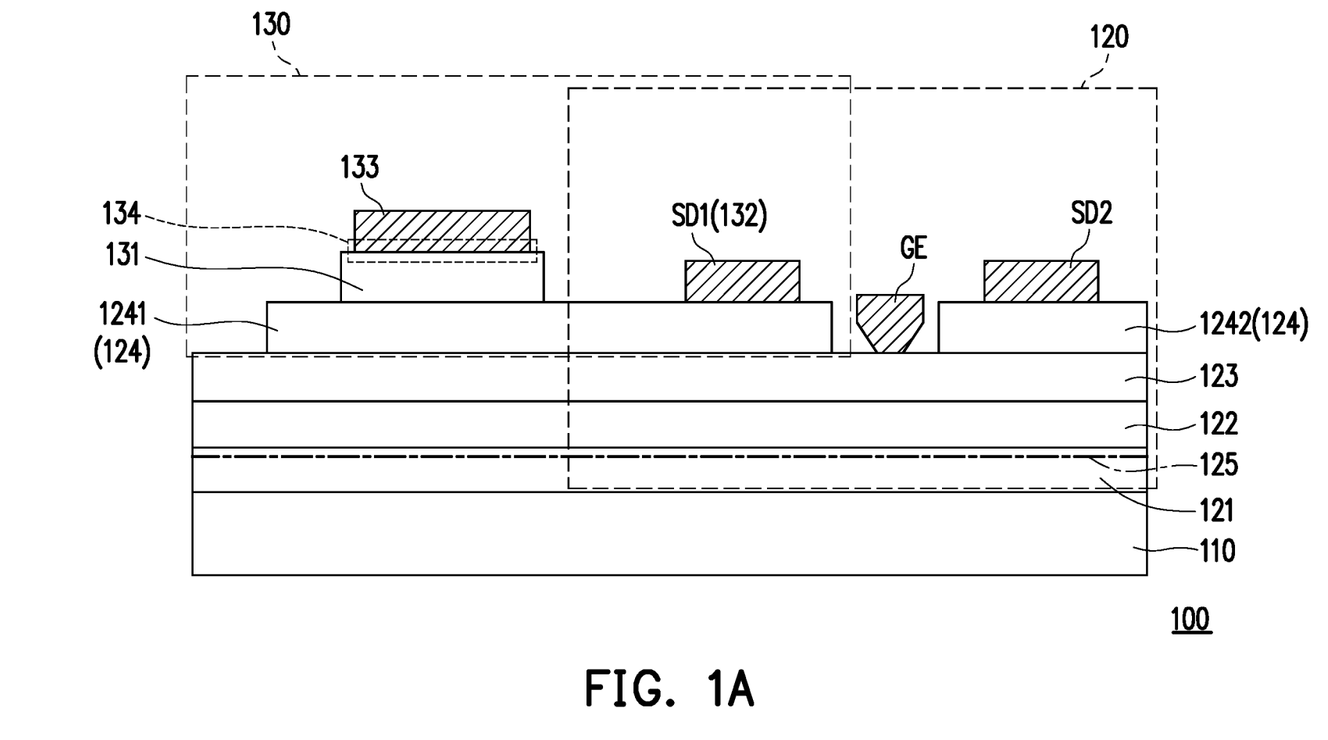
FIG. 1A is a schematic cross-sectional view of an electronic device of an embodiment of the disclosure.
Figure 1B:
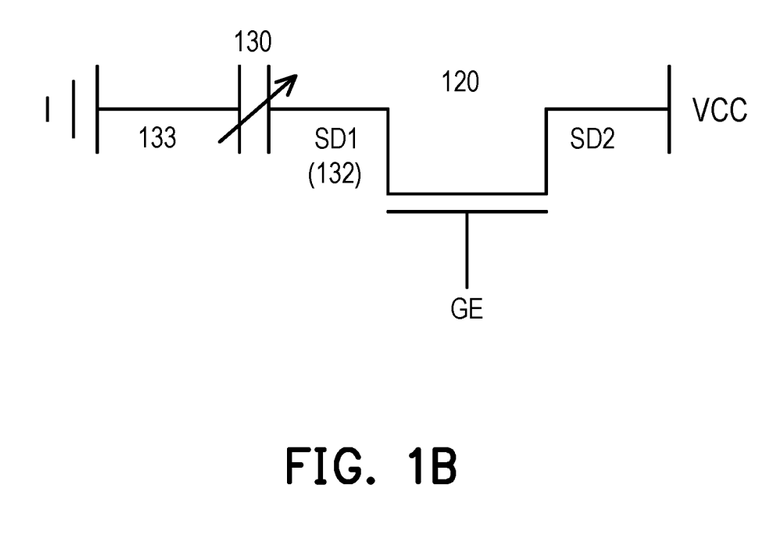
FIG. 1B is a schematic circuit diagram of the electronic device of FIG. 1A.

FIG. 1A is a schematic cross-sectional view of an electronic device of an embodiment of the disclosure. FIG. 1B is a schematic circuit diagram of the electronic device of FIG. 1A.

Referring to FIG. 1A, an electronic device 100 of the present embodiment may include a substrate 110, a transistor 120, and a variable capacitor 130. The transistor 120 is disposed on the substrate 110. The variable capacitor 130 is disposed on the substrate 110, and the variable capacitor 130 is adjacent to the transistor 120. In other words, the variable capacitor 130 and the transistor 120 are disposed on the same substrate 110. In some embodiments, there is no other active element or passive element between the variable capacitor 130 and the transistor 120, but the disclosure is not limited thereto. In the present embodiment, the material of the transistor 120 and the material of the variable capacitor 130 both include a III-V semiconductor material. In particular, the III-V semiconductor material is, for example, gallium arsenide (GaAs), indium arsenide (InAs), aluminum arsenide (AlAs), indium gallium arsenide (InGaAs), aluminum gallium arsenide (AlGaAs), indium aluminum gallium arsenide (InAlGaAs), aluminum nitride (AlN), gallium nitride (GaN), aluminum gallium nitride (AlGaN), indium gallium nitride (InGaN), aluminum indium nitride (AlInN), aluminum indium gallium nitride (AlGaInN), the above materials doped with an N-type dopant, the above materials doped with a P-type dopant, or a combination of the above, but is not limited thereto. The substrate 110 may include a rigid substrate, a flexible substrate, or a combination of the above. In the present embodiment, the material of the substrate 110 may include glass, quartz, sapphire, a semiconductor containing an arsenic compound (such as gallium arsenide, but not limited to), ceramic, polycarbonate (PC), polyimide (PI), polyethylene terephthalate (PET), other suitable substrate materials, or a combination of the above, but is not limited thereto. For example, the material of the substrate 110 is, for example, a semiconductor containing gallium arsenide, but is not limited thereto.

In the present embodiment, the transistor 120 may be a high electron mobility transistor (HEMT) or a heterojunction bipolar transistor (HBT), but is not limited thereto. An HEMT is exemplified in the following description.

Specifically, in the present embodiment, the transistor 120 includes a buffer layer 121, a first semiconductor material layer 122, a second semiconductor material layer 123, a heavily-doped semiconductor layer 124 (including a first region 1241 and a second region 1242), a gate GE, a source SD1, and a drain SD2. In particular, the manufacturing method of the buffer layer 121, the first semiconductor material layer 122, the second semiconductor material layer 123, and the heavily-doped semiconductor layer 124, for example, is first manufacturing by an epitaxy process, and then patterning by lithography etching. The method of the epitaxy process is, for example, metal-organic chemical vapor deposition (MOCVD), but is not limited thereto.

In the present embodiment, the buffer layer 121 is disposed on the substrate 110. The material of the buffer layer 121 includes a III-V semiconductor material. For example, the material of the buffer layer 121 is gallium arsenide, but is not limited thereto.

In the present embodiment, the first semiconductor material layer 122 is disposed on the buffer layer 121. The first semiconductor material layer 122 and the substrate 110 are respectively located at opposite sides of the buffer layer 121. The material of the first semiconductor material layer 122 includes a III-V semiconductor material. For example, the material of the first semiconductor material layer 122 is aluminum gallium arsenide, but is not limited thereto. Moreover, in the present embodiment, since electrons may be highly accumulated at the heterojunction between the first semiconductor material layer 122 and the buffer layer 121, the heterojunction between the first semiconductor material layer 122 and the buffer layer 121 may have a two-dimensional electron gas (2DEG) 125.

In the present embodiment, the second semiconductor material layer 123 is disposed on the first semiconductor material layer 122. The second semiconductor material layer 123 and the buffer layer 121 are respectively located at two opposite sides of the first semiconductor material layer 122. The material of the second-type semiconductor material layer 123 includes a III-V semiconductor material doped with an N-type dopant or a III-V semiconductor material doped with a P-type dopant. For example, the material of the second-type semiconductor material layer 123 is N-type aluminum gallium arsenide, but is not limited thereto.

In the present embodiment, the heavily-doped semiconductor layer 124 includes the first region 1241 and the second region 1242. The first region 1241 and the second region 1242 of the heavily-doped semiconductor layer 124 are respectively disposed on the second semiconductor material layer 123. The first region 1241 and the second region 1242 of the heavily-doped semiconductor layer 124 are physically separated from each other. The heavily-doped semiconductor layer 124 and the first semiconductor material layer 122 are respectively located at two opposite sides of the second semiconductor material layer 123. The material of the heavily-doped semiconductor layer 124 includes a III-V semiconductor material doped with an N-type dopant or a III-V semiconductor material doped with a P-type dopant. For example, the material of the heavily-doped semiconductor layer 124 is N-type gallium arsenide, but is not limited thereto.

In the present embodiment, the gate GE is disposed on the second semiconductor material layer 123. The gate GE is in contact with the second semiconductor material layer 123. The gate GE and the first semiconductor material layer 122 are respectively located at two opposite sides of the second semiconductor material layer 123. The gate GE is located between the first region 1241 and the second region 1242 of the heavily-doped semiconductor layer 124. The material of the gate GE includes gold, platinum, silver, titanium, chromium, palladium, nickel, other suitable metal materials, or an alloy or combination of the above materials, but is not limited thereto.

In the present embodiment, the source SD1 and the drain SD2 are respectively disposed on the first region 1241 and the second region 1242 of the heavily-doped semiconductor layer 124. The source SD1 and the second semiconductor material layer 123 are respectively located at two opposite sides of the first region 1241 of the heavily-doped semiconductor layer 124. The drain SD2 and the second semiconductor material layer 123 are respectively located at two opposite sides of the second region 1242 of the heavily-doped semiconductor layer 124. An ohmic contact may be formed between the source SD1 and the first region 1241 of the heavily-doped semiconductor layer 124, and an ohmic contact may be formed between the drain SD2 and the second region 1242 of the heavily-doped semiconductor layer 124. The material of the source SD1 and the drain SD2 includes gold, platinum, silver, titanium, chromium, palladium, nickel, other metal materials that may form an ohmic contact with the heavily-doped semiconductor layer 124, or an alloy or combination of the above materials, but is not limited thereto.

In the present embodiment, the variable capacitor 130 may be a variable capacitance diode (varactor), but is not limited thereto. Specifically, in the present embodiment, the variable capacitor 130 includes the first region 1241 of the heavily-doped semiconductor layer 124, a lightly-doped semiconductor layer 131, a first electrode 132, and a second electrode 133. In particular, the manufacturing method of the lightly-doped semiconductor layer 131 is, for example, first manufacturing using an epitaxy process, and then patterning by lithography etching. The method of the epitaxy process is, for example, metal-organic chemical vapor deposition (MOCVD), but is not limited thereto.

In the present embodiment, the first region 1241 of the heavily-doped semiconductor layer 124 is disposed on the substrate 110. The lightly-doped semiconductor layer 131 is disposed on the first region 1241 of the heavily-doped semiconductor layer 124. The lightly-doped semiconductor layer 131 and the second semiconductor material layer 123 are respectively located at two opposite sides of the first region 1241 of the heavily-doped semiconductor layer 124. The material of the lightly-doped semiconductor layer 131 includes a III-V semiconductor material doped with an N-type dopant or a III-V semiconductor material doped with a P-type dopant. For example, the material of the lightly-doped semiconductor layer 131 is N-type gallium arsenide, but is not limited thereto. In addition, in the present embodiment, the doping concentration of the dopant in the lightly-doped semiconductor layer 131 is less than the doping concentration of the dopant in the heavily-doped semiconductor layer 124.

In the present embodiment, the first electrode 132 is disposed on the first region 1241 of the heavily-doped semiconductor layer 124, and the first electrode 132 may be electrically connected to the first region 1241 of the heavily-doped semiconductor layer 124. In the present embodiment, the source SD1 of the transistor 120 may be regarded as the first electrode 132 of the variable capacitor 130. That is, the source SD1 of the transistor 120 and the first electrode 132 of the variable capacitor 130 may share the same metal electrode, but is not limited thereto. In the present embodiment, the material of the first electrode 132 is the same as the material of the source electrode SD1, and therefore is not repeated herein.

In the present embodiment, the second electrode 133 is disposed on the lightly-doped semiconductor layer 131. In addition, since a Schottky contact may be formed between the second electrode 133 and the lightly-doped semiconductor layer 131, the junction between the second electrode 133 and the lightly-doped semiconductor layer 131 may have a depletion region 134, and the variable capacitor 130 may also serve as a Schottky diode. In the present embodiment, the material of the second electrode 133 includes gold, platinum, silver, titanium, chromium, palladium, nickel, other metal materials that may form a Schottky contact with the lightly-doped semiconductor layer 131, or an alloy or combination of the above materials, but is not limited thereto.

Referring to both FIG. 1A and FIG. 1B, in the electronic device 100 of the present embodiment, the transistor 120 may be electrically connected to the variable capacitor 130, the transistor 120 may be used as a switching element and have a switch function, and the variable capacitor 130 may be used as a capacitive storage element and have the function of adjusting capacitance. Specifically, the voltage of the gate GE may be used to adjust the position of the Fermi level and control the electron concentration of the two-dimensional electron gas 125, so that the transistor 120 is turned on or off. When the transistor 120 is turned on, a high voltage signal VCC provided to the drain SD2 of the transistor 120 may be transmitted to the source SD1 and the first electrode 132 via a channel formed by the two-dimensional electron gas 125; then, the signal is transferred to the lightly-doped semiconductor layer 131 of the variable capacitor 130 via the first region 1241 of the heavily-doped semiconductor layer 124; then, since the depletion region 134 may be formed at the junction between the second electrode 133 that is grounded (or connected to a low voltage signal) and the lightly-doped semiconductor layer 131, the variable capacitor 130 may store capacitance.

In the present embodiment, the storage capacity of the variable capacitor 130 may be changed by adjusting the size of the depletion region 134. For example, when a forward bias is provided to the lightly-doped semiconductor layer 131 of the variable capacitor 130, the depletion region 134 is smaller, and the storable capacitance of the variable capacitor 130 is smaller; conversely, when a reverse bias is provided to the lightly-doped semiconductor layer 131 of the variable capacitor 130, the depletion region 134 is larger, and the storable capacitance of the variable capacitor 130 is larger.

In the present embodiment, since the material of the transistor 120 and the material of the variable capacitor 130 in the electronic device 100 both include a III-V semiconductor material, and both the transistor 120 and the variable capacitor 130 may be manufactured by an epitaxy process with lithography etching, in the present embodiment, the transistor 120 and the variable capacitor 130 may be formed on the same substrate 110 together, and then the transistor 120 and the variable capacitor 130 are integrated on the same substrate 110. In addition, compared with a general silicon wafer process, a process using a III-V semiconductor material may also reduce manufacturing costs.

In the present embodiment, since the source SD1 of the transistor 120 and the first electrode 132 of the variable capacitor 130 may share the same metal electrode, there is no need to additionally provide another metal electrode and a pad bonded with the other metal electrode. Moreover, since the transistor 120 may be electrically connected to the variable capacitor 130, and the transistor 120 and the variable capacitor 130 may share the same metal electrode (i.e., the second electrode 133) that is grounded (or connected to a low voltage signal), it may not be necessary to additionally provide another metal electrode that is grounded (or connected to a low voltage signal) and a pad bonded with the other metal electrode that is grounded (or connected to a low voltage signal). In other words, since the transistor 120 and the variable capacitor 130 may be integrated on the same substrate 110 and share the same metal electrode (i.e., the source SD1 and the first electrode 132) and the same metal electrode that is grounded (or connected to a low voltage signal) (i.e., the second electrode 133), the number of metal electrodes and corresponding pads may be reduced or space may be saved, so that the electronic device 100 of the present embodiment has the effect of simplifying manufacturing process, reducing costs, or reducing dimensions.

Other embodiments are provided below for illustration. It should be noted here that the following embodiments adopt the reference numerals and part of the content of the above embodiments, wherein the same reference numerals are used to represent the same or similar elements, and the description of the same technical content is omitted. For the description of the omitted parts, reference may be made to the above embodiments, which is not repeated in the following embodiments.

Figure 2:
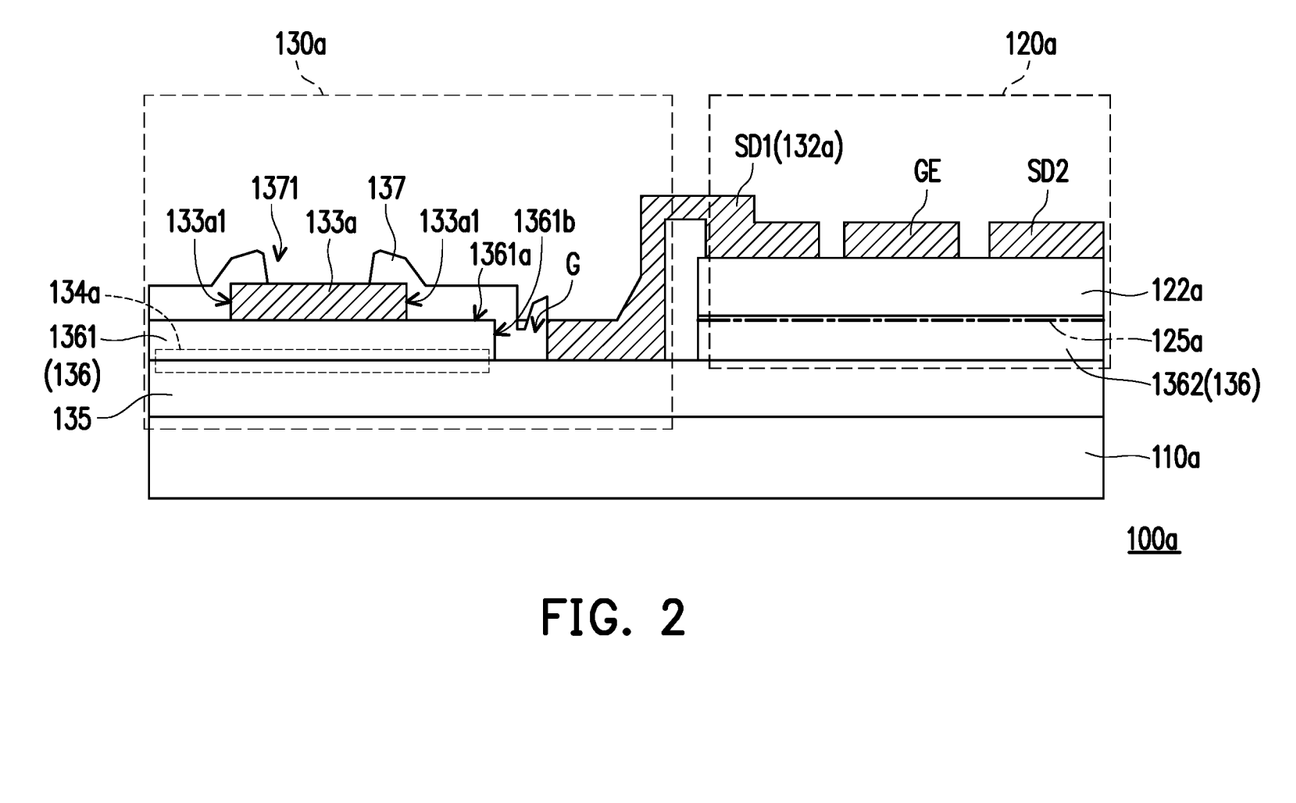
FIG. 2 is a schematic cross-sectional view of an electronic device of another embodiment of the disclosure.

FIG. 2 is a schematic cross-sectional view of an electronic device of another embodiment of the disclosure. Please refer to FIG. 1A and FIG. 2 at the same time. An electronic device 100a of the present embodiment is substantially similar to the electronic device 100 of FIG. 1A. Therefore, the same and similar members in the two embodiments are not repeated herein. The electronic device 100a of the present embodiment is different from the electronic device 100 mainly in that, in the electronic device 100a of the present embodiment, a variable capacitor 130a does not have a Schottky contact, nor is it a Schottky diode.

Specifically, referring to FIG. 2, in the electronic device 100a of the present embodiment, the variable capacitor 130a includes a first-type semiconductor layer 135, a first part 1361 of a second-type semiconductor layer 136, a first-type pad 132a, a second-type pad 133a, and an insulating layer 137. In particular, the first-type semiconductor layer 135 is disposed on a substrate 110a. The material of the first-type semiconductor layer 135 includes a III-V semiconductor material. For example, the material of the first-type semiconductor layer 135 is, for example, N-type gallium nitride, but is not limited thereto.

The second-type semiconductor layer 136 includes the first part 1361 and a second part 1362. The first part 1361 and the second part 1362 of the second-type semiconductor layer 136 are physically separated from each other. The first part 1361 of the second-type semiconductor layer 136 is disposed on the first-type semiconductor layer 135. The first part 1361 of the second-type semiconductor layer 136 and the substrate 110a are respectively located at two opposite sides of the first-type semiconductor layer 135. The material of the second-type semiconductor layer 136 includes a III-V semiconductor material. For example, the material of the second-type semiconductor layer 136 is, for example, P-type gallium nitride, but is not limited thereto. In the present embodiment, since the conductivity type of the first-type semiconductor layer 135 is different from the conductivity type of the second-type semiconductor layer 136, the junction between the first-type semiconductor layer 135 and the first part 1361 of the second-type semiconductor layer 136 may have a depletion region 134a. In the present embodiment, the material of the substrate 110a is, for example, sapphire, but is not limited thereto.

The first-type pad 132a is disposed on the first-type semiconductor layer 135, and the first-type pad 132a may be electrically connected to the first-type semiconductor layer 135. The first-type pad 132a is disposed between the first part 1361 and the second part 1362 of the second-type semiconductor layer 136. The first-type pad 132a is in contact with the first-type semiconductor layer 135, and the first-type pad 132a is not in contact with the second-type semiconductor layer 136. The second-type pad 133a is disposed on the first part 1361 of the second-type semiconductor layer 136, and the second-type pad 133a may be electrically connected to the first part 1361 of the second-type semiconductor layer 136. In the present embodiment, the conductivity type of the first-type pad 132a is different from the conductivity type of the second-type pad 133a. The material of the first-type pad 132a and the second-type pad 133a may include silver, copper, aluminum, molybdenum, tungsten, gold, chromium, nickel, platinum, titanium, iridium, rhodium, indium, bismuth, other suitable metals, or an alloy or combination of the above materials, but is not limited thereto.

The insulating layer 137 is disposed on the second-type pad 133a, the insulating layer 137 may be extended along a side surface 133a1 at two sides of the second-type pad 133a and an upper surface 1361a of the first part 1361 and cover part of the upper surface 1361a of the first part 1361, and the insulating layer 137 may also be extended along a side surface 1361b of the first part 1361 and be filled in a gap G between the first part 1361 and the first-type pad 132a. The insulating layer 137 has an opening 1371 to expose part of the second-type pad 133a. The insulating layer 137 may have a single-layer or multi-layer structure, and may include, for example, an organic material, an inorganic material (such as silicon nitride), or a combination of the above, but is not limited thereto.

In the present embodiment, a transistor 120a includes the second part 1362 of the second-type semiconductor layer 136, a semiconductor material layer 122a, the gate GE, the source SD1, and the drain SD2. In particular, the second part 1362 of the second-type semiconductor layer 136 is disposed on the first-type semiconductor layer 135. The second part 1362 of the second-type semiconductor layer 136 and the first-type semiconductor layer 135 are respectively located at two opposite sides of the substrate 110a.

The semiconductor material layer 122a is disposed on the second part 1362 of the second-type semiconductor layer 136. The semiconductor material layer 122a and the first-type semiconductor layer 135 are respectively located at two opposite sides of the second part 1362 of the second-type semiconductor layer 136. The material of the semiconductor material layer 122a includes a III-V semiconductor material. For example, the material of the semiconductor material layer 122a is aluminum gallium nitride, but is not limited thereto. Moreover, in the present embodiment, since electrons may be accumulated at a high degree at the heterojunction between the semiconductor material layer 122a and the second part 1362 of the second-type semiconductor layer 136, the heterojunction between the semiconductor material layer 122a and the second part 1362 of the second-type semiconductor layer 136 may have a two-dimensional electron gas 125a.

The gate GE is disposed on the semiconductor material layer 122a. The source SD1 and the drain SD2 are respectively disposed on the semiconductor material layer 122a. The gate GE is located between the source SD1 and the drain SD2. The gate GE (or the source SD1 or the drain SD2) and the second part 1362 of the second-type semiconductor layer 136 are respectively located at two opposite sides of the semiconductor material layer 122a. In the present embodiment, the source SD1 of the transistor 120a may be regarded as the first-type pad 132a of the variable capacitor 130a.

In the present embodiment, since the material of the transistor 120a and the material of the variable capacitor 130a both include a III-V semiconductor material, the first-type semiconductor layer 135, the second-type semiconductor layer 136, and the semiconductor material layer 122a may all be manufactured by an epitaxy process with lithography etching, and the transistor 120a and the variable capacitor 130a may be formed together on the same substrate 110a.

Figure 3:
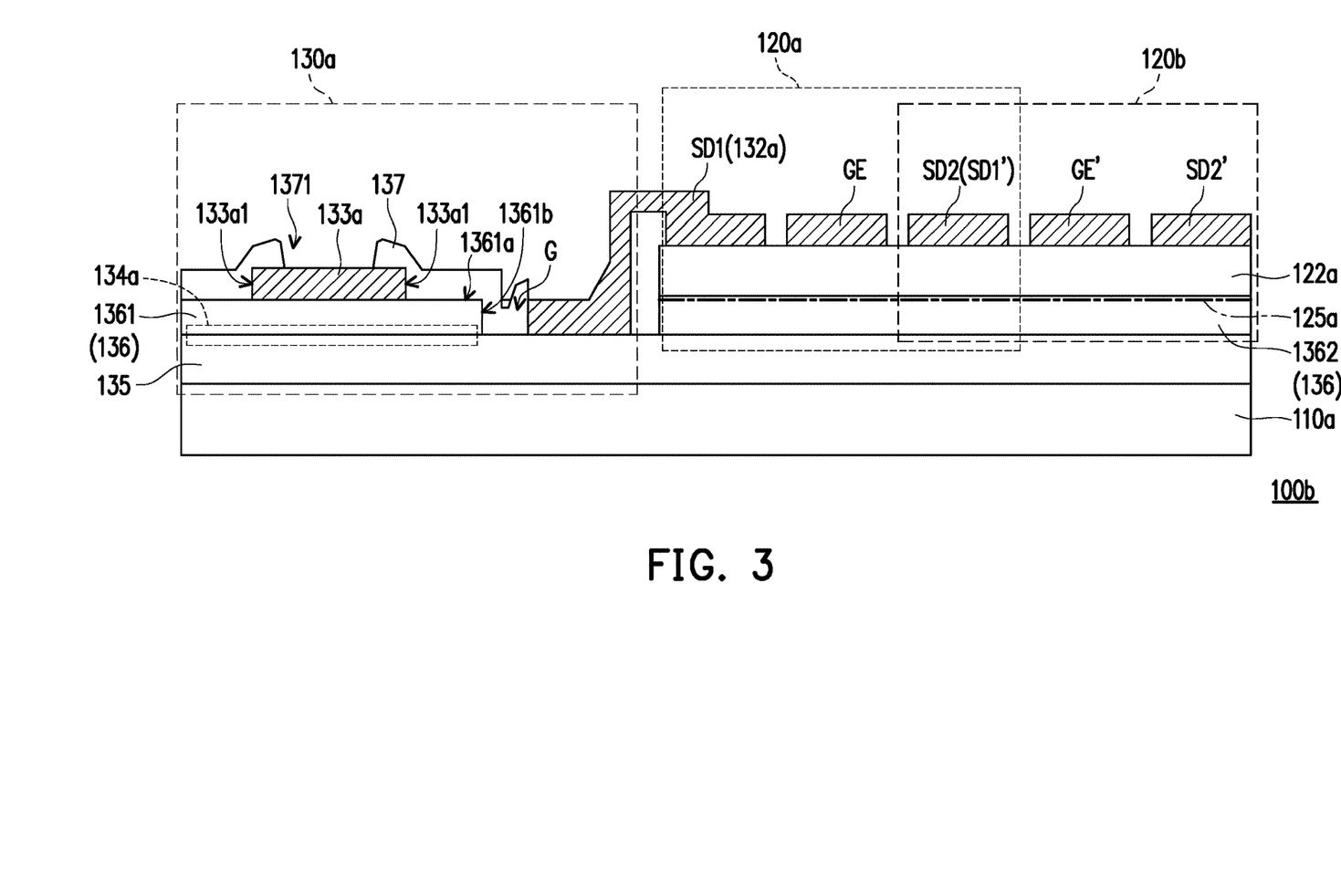
FIG. 3 is a schematic cross-sectional view of an electronic device of another embodiment of the disclosure.

FIG. 3 is a schematic cross-sectional view of an electronic device of another embodiment of the disclosure. Please refer to FIG. 2 and FIG. 3 at the same time. An electronic device 100b of the present embodiment is substantially similar to the electronic device 100a of FIG. 2. Therefore, the same and similar members in the two embodiments are not repeated herein. The electronic device 100b of the present embodiment is different from the electronic device 100a mainly in that the electronic device 100b of the present embodiment further includes a transistor 120b.

Specifically, referring to FIG. 3, in the electronic device 100b of the present embodiment, the transistor 120b includes the second part 1362 of the second-type semiconductor layer 136, the semiconductor material layer 122a, a gate GE', a source SD1', and a drain SD2'. In particular, the gate GE', the source SD1', and the drain SD2' are respectively disposed on the semiconductor material layer 122a. The gate GE' is located between the source SD1' and the drain SD2'. The drain SD2 of the transistor 120a and the source SD1' of the transistor 120b are located between the gate GE of the transistor 120a and the gate GE' of the transistor 120b. In particular, the drain SD2 of the transistor 120a and the source SD1' of the transistor 120b may share the same metal electrode, thereby reducing the number of pads. Moreover, in the present embodiment, the transistor 120a and the transistor 120b may be connected in series and used as a switching element together, so that the overall control effect of the switching element may be improved or leakage issue may be alleviated.

Based on the above, in the electronic device of an embodiment of the disclosure, since the material of the transistor and the material of the variable capacitor in the electronic device both include a III-V semiconductor material, the transistor and the variable capacitor may be formed on the same substrate together. In addition, compared with a general silicon wafer process, a process using a III-V semiconductor material may also reduce manufacturing costs. In addition, since the source of the transistor and the first electrode of the variable capacitor may share the same metal electrode, and the transistor and the variable capacitor may share the same metal electrode (i.e., the second electrode) that is grounded (or connected to a low voltage signal), the number of metal electrodes and corresponding pads may be reduced or space may be saved, so that the electronic device of the present embodiment has the effect of simplifying manufacturing process, reducing costs, or reducing dimensions.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. An electronic device, comprising:
a substrate;
a transistor disposed on the substrate, wherein the transistor is a high electron mobility transistor; and
a variable capacitor disposed on the substrate and adjacent to the transistor, wherein the variable capacitor is a variable capacitance diode;
wherein a material of the transistor and a material of the variable capacitor both comprise a III-V semiconductor material,
wherein the variable capacitor comprises:
a first-type semiconductor layer disposed on the substrate;
a first part of a second-type semiconductor layer disposed on the first-type semiconductor layer;
a first-type pad disposed on the first-type semiconductor layer and electrically connected to the first-type semiconductor layer; and
a second-type pad disposed on the first part of the second-type semiconductor layer and electrically connected to the first part of the second-type semiconductor layer,
wherein the transistor comprises:
a second part of the second-type semiconductor layer disposed on the first-type semiconductor layer;
a semiconductor material layer disposed on the second part of the second-type semiconductor layer;
a gate disposed on the semiconductor material layer; and
a source and a drain respectively disposed on the semiconductor material layer.

2. The electronic device of claim 1, wherein a conductivity type of the first-type semiconductor layer is different from a conductivity type of the second-type semiconductor layer.

3. The electronic device of claim 1, wherein the first-type pad is disposed between the first part and the second part of the second-type semiconductor layer.

4. The electronic device of claim 1, wherein the first-type pad is in contact with the first-type semiconductor layer.

5. The electronic device of claim 1, wherein the first-type pad is not in contact with the second-type semiconductor layer.

6. The electronic device of claim 1, wherein the source is regarded as the first-type pad.

7. The electronic device of claim 1, wherein the first part and the second part of the second-type semiconductor layer are physically separated from each other.

8. The electronic device of claim 1, wherein a junction between the first-type semiconductor layer and the first part of the second-type semiconductor layer has a depletion region.

9. The electronic device of claim 1, wherein the transistor is electrically connected to the variable capacitor.

* * * * *